(12) United States Patent
Brooks et al.

(10) Patent No.: US 8,863,956 B2
(45) Date of Patent: Oct. 21, 2014

(54) PACKAGING SYSTEM FOR PROTECTION OF IC WAFERS DURING FABRICATION, TRANSPORT AND STORAGE

(76) Inventors: Ray G. Brooks, Bedford, TX (US); Timothy Wayne Brooks, Arlington, TX (US)

(*) Notice: Subject to any disclaimer, the term of this patent is extended or adjusted under 35 U.S.C. 154(b) by 347 days.

(21) Appl. No.: 13/351,911

(22) Filed: Jan. 17, 2012

(65) Prior Publication Data

US 2012/0181215 A1 Jul. 19, 2012

Related U.S. Application Data

(60) Provisional application No. 61/434,194, filed on Jan. 19, 2011.

(51) Int. Cl.
*B65D 85/48* (2006.01)
*H01L 21/673* (2006.01)

(52) U.S. Cl.
CPC .............................. *H01L 21/67369* (2013.01)
USPC ............ 206/710; 206/303; 206/454; 206/586

(58) Field of Classification Search
USPC ......... 206/303, 454, 455, 523, 591, 593, 594, 206/710, 711, 718–721, 586; 211/41.18; 118/500

See application file for complete search history.

(56) References Cited

U.S. PATENT DOCUMENTS

| | | | |
|---|---|---|---|
| 4,944,916 A * | 7/1990 | Franey | 422/8 |
| 5,154,886 A * | 10/1992 | Franey et al. | 422/8 |
| 5,725,100 A | 3/1998 | Yamada | |
| 5,836,454 A | 11/1998 | Evers | |
| 6,286,684 B1 * | 9/2001 | Brooks et al. | 206/710 |
| 6,871,741 B2 * | 3/2005 | Bhatt et al. | 206/454 |
| 6,926,150 B2 | 8/2005 | Amador et al. | |
| 6,933,033 B1 | 8/2005 | Forsyth et al. | |
| 6,988,620 B2 | 1/2006 | Haggard et al. | |
| 6,989,563 B1 * | 1/2006 | Achuthan et al. | 257/315 |
| 7,059,475 B2 | 6/2006 | Zabka et al. | |
| 7,578,392 B2 * | 8/2009 | Brooks et al. | 206/710 |
| 2002/0144927 A1 * | 10/2002 | Brooks et al. | 206/710 |
| 2004/0045263 A1 | 3/2004 | Haggard et al. | |
| 2012/0125808 A1 * | 5/2012 | Bonora | 206/711 |
| 2013/0299384 A1 * | 11/2013 | Fuller | 206/711 |

* cited by examiner

*Primary Examiner* — Luan K Bui
(74) *Attorney, Agent, or Firm* — Geoffrey A. Mantooth

(57) ABSTRACT

The packaging system includes an enclosure having an interior volume. A wafer stack, comprising plural wafers and separators in contact with the wafers, is located in the interior volume. The separators have raised bumps extending from each side. The bumps create spaces that allow air to flow therethrough. The separator film intercepts and captures airborne molecular contaminants belonging to organic and inorganic chemical families. In addition, the film is dissipative to static discharge. Furthermore, the bumps provided by the separators protect the fragile wafers from damage due to mechanical shock. The separators are also provided with a peripheral ring or embossment, which contacts the wafer edges and further protects the wafers from damage to mechanical shock. Air cushions can be provided in the wafer stack, which cushions are provided with bands to regulate the compression.

13 Claims, 6 Drawing Sheets

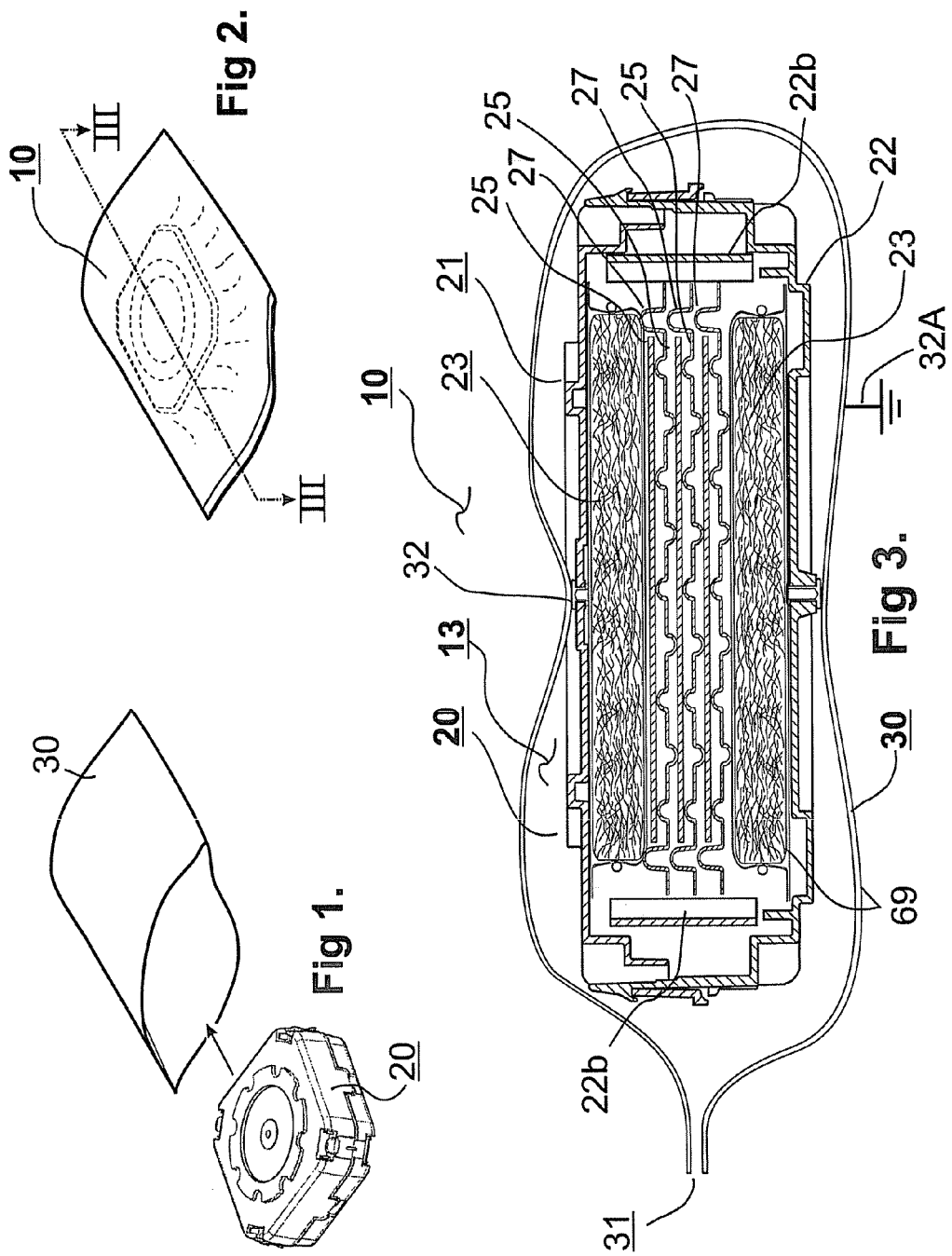

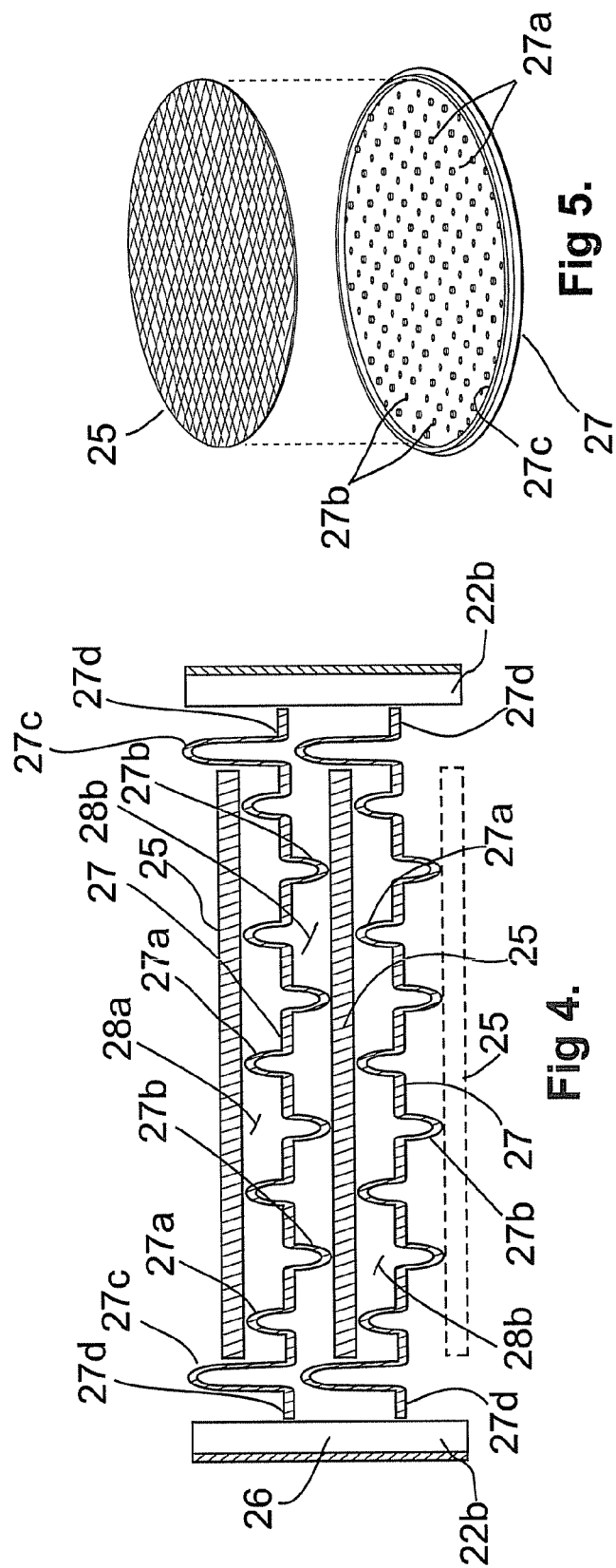

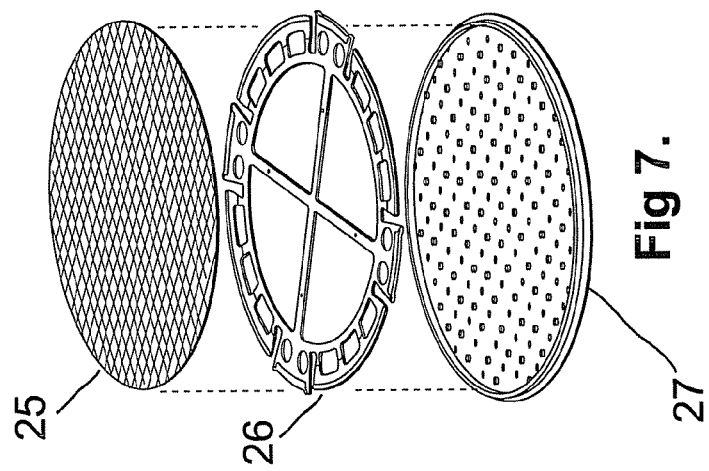
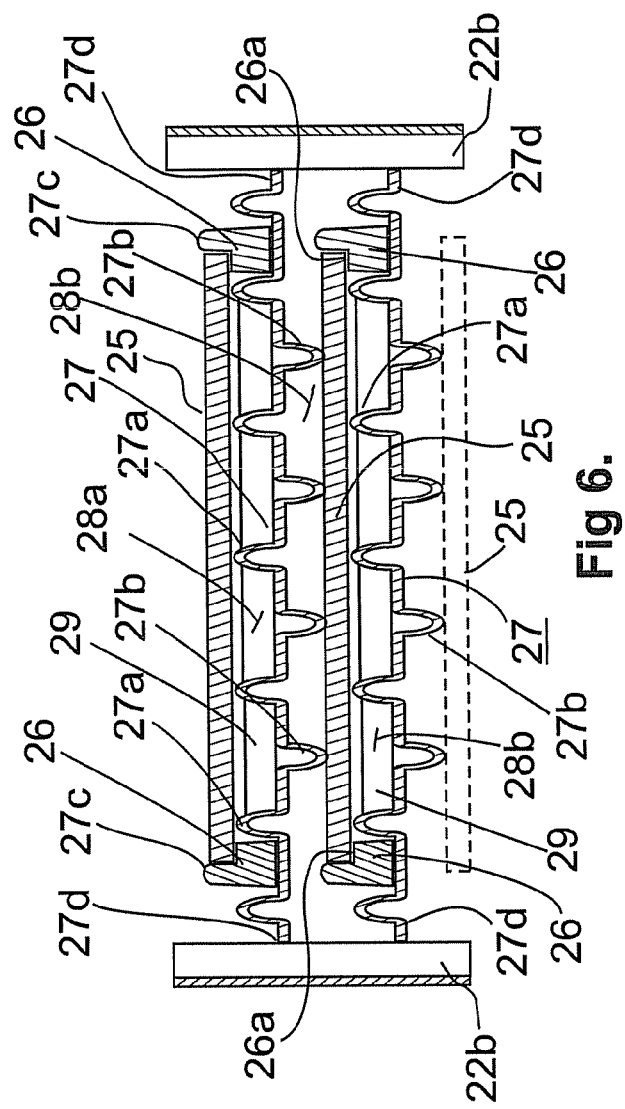

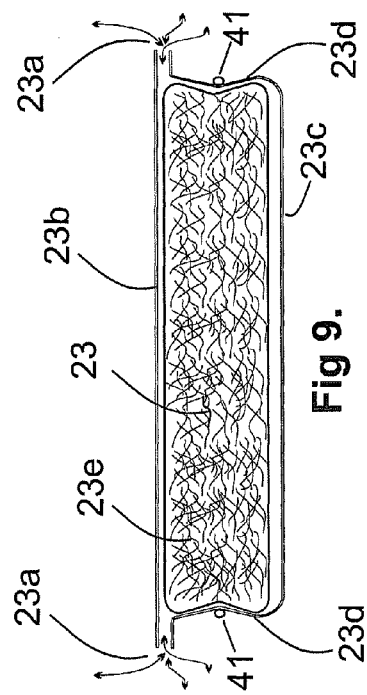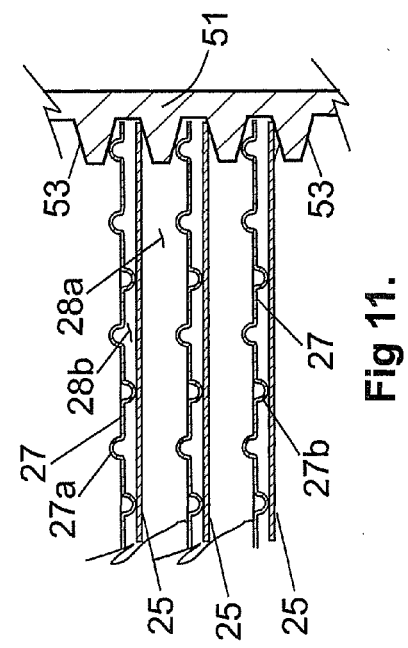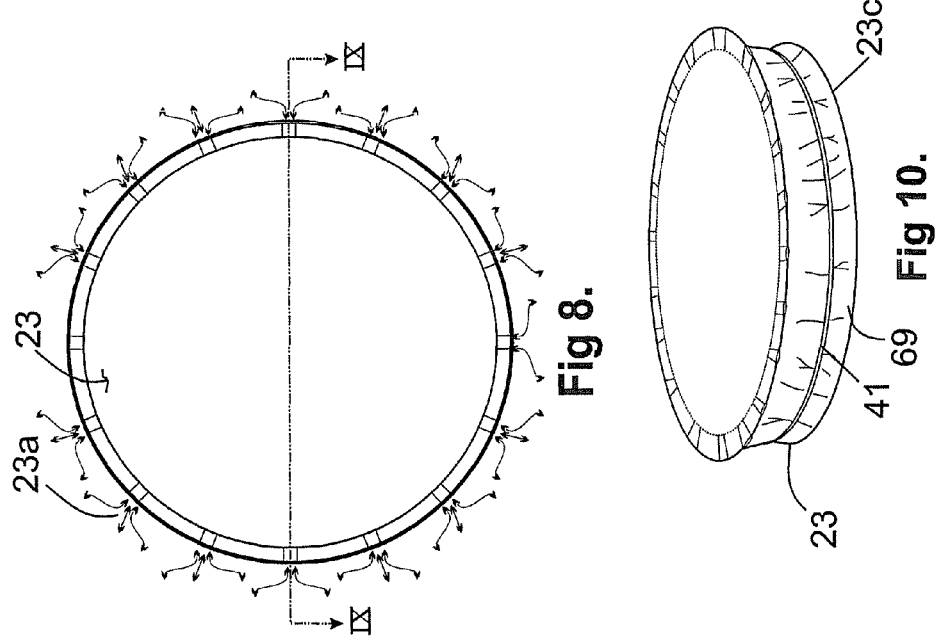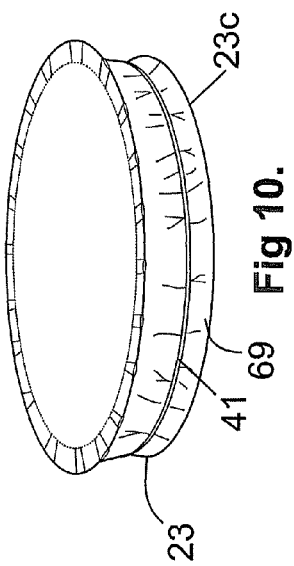

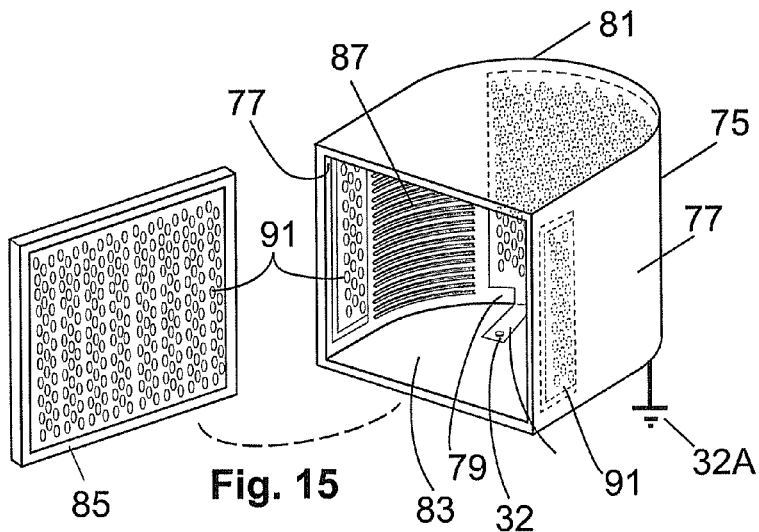
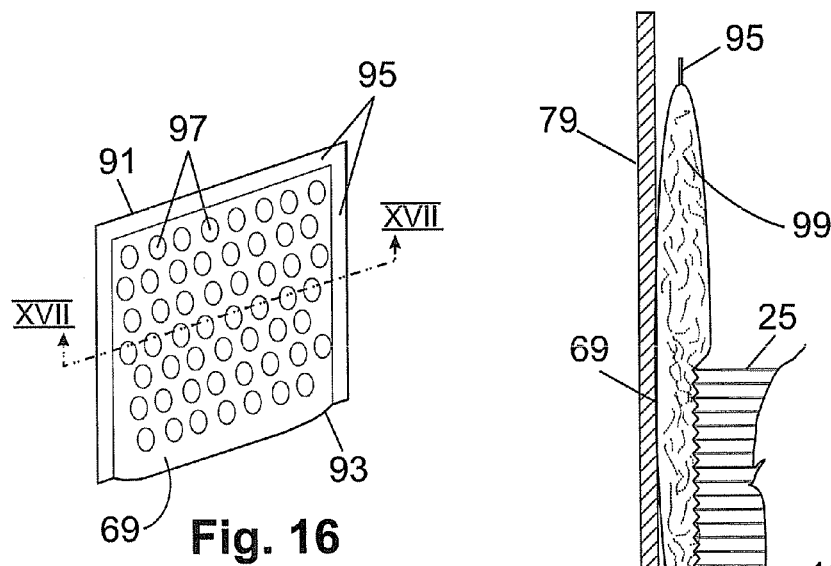
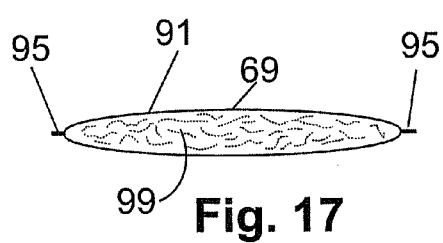
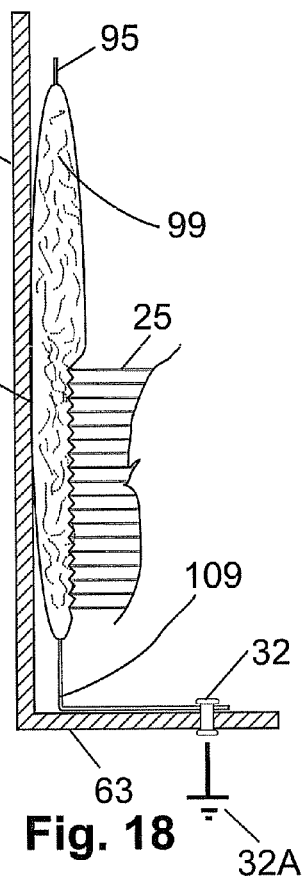

PACKAGING SYSTEM FOR PROTECTION OF IC WAFERS DURING FABRICATION, TRANSPORT AND STORAGE

This application claims the benefit of U.S. provisional application Ser. No. 61/434,194, filed Jan. 19, 2011.

FIELD OF THE INVENTION

The present invention relates to a packaging system for protecting integrated circuit (IC) wafers.

BACKGROUND OF THE INVENTION

Since the beginning of IC wafer fabrication, manufacturers have waged war against corrosive contaminants, relying on processing equipment within clean rooms having filters, monitors and/or mini-environments using containers identified as PODs, FOSBs (front opening shipping box) and/or FOUPs (front opening unified pod). These containers employ the concepts of Standard Mechanical Interface (SMIF). The clean rooms and containers have the purpose of significantly reducing IC die yield losses traceable to airborne molecular contaminants (AMCs). Examples of AMCs are HF (hafnium), HCL (hydrochloride) and VOC (volatile organic compounds). Although AMCs remain elusive, they are traceable to indoor and outdoor chemical activities.

Nitrogen purging (pressure method) is one prior art method of the reducing AMCs in the wafer container and use of a vacuum is the other. However, both are expensive and tend to move the AMCs to other locations where they can cause problems.

Even further, these same manufacturers are known to employ wafer-packaging methodologies that specify containers with little or no adequate features to simultaneously control breakage, corrosive and/or electrical damage to packaged IC wafers during transport and/or storage phases after fabrication phases for further downstream processing. This oversight can add to the reduced IC die yields after probing phases and before bonding phases.

AMCs known to cause corrosive damage to IC wafers being fabricated within clean rooms mostly belong to the organic and inorganic chemical families. Inorganic AMCs such as HL, H2S, HNO3 and HCL are mostly traceable to indoor chemical activities required for wafer fabrication and organic AMCs such as CnHx are mostly traceable to outdoor activities such as vehicle exhaust fumes. Further, wafer boxes, separators and cushions requiring "chemical additives" to achieve dissipative (10E5 to <10E11 ohms) surfaces to avoid electro-static discharge (ESD) events can outgas AMCs resulting in corrosive damage to surfaces of packaged wafers. Even further, there is the additional problem defined as "waves of mechanical shock energy" traceable to container mishandling that can create breakage damage to packaged wafers during transport and/or storage phases. Accordingly present day wafer shipping containers have little or no features to simultaneously address breakage, corrosive and ESD damages all of which could result in reduction in IC die yields. This can be a serious problem for 21st Century IC wafers such as 300 mm and 450 mm sizes with smaller geometries having much faster speeds. This relates to said problem traceable to the fact at one point in time corrosive AMCs within environments of containers packaged with wafers during fabrication, storage and/or transport stages were considered harmless, but now are attributed to costly IC die losses traceable to chemical interaction with AMCs.

SUMMARY OF THE INVENTION

The present invention provides a packaging system for the protection of IC wafers during fabrication, transport and storage phases. The wafers have surface components such as bond pads, solder balls and interconnects which are susceptible to damage due to corrosion, mechanical shock and/or electrical static discharge. The packaging system comprises an enclosure having an interior volume in which a wafer stack is located. The wafer stack comprises plural wafers and separators in contact with the wafers. Each separator has two sides and has raised bumps extending from each side of the separator sheet. The bumps create spaces between the respective separator and the respective wafer, which spaces allow air to flow there through. At least one of the separators is made of a polymer film material having the properties to intercept and capture airborne molecular contaminants hereinafter referred to as AMCs belonging to either or both chemical organic and inorganic families for which the material is dissipative to static discharge.

In accordance with one aspect of this invention, the separator is a plastic film material comprises activated carbon and a component taken from the group of copper, aluminum, tin, silver and a rare earth.

In accordance with another aspect, the wafers have edges subject to mechanical shock. The separators are sheets, the separators having peripheral rings located adjacent to the wafer edges so as to protect each associated packaged wafer edge from shock or physical damage.

In accordance with another aspect, the peripheral rings are embossed in the separator sheets.

In accordance with another aspect, a support ring made of a polymer, is located adjacent to the separator, the support ring is rigid.

In accordance with another aspect, at least one cushion is located in the wafer stack to absorb mechanical shock energy. The cushion comprises a compressible core and a flexible envelope around the core. The envelope has vents to allow gas to pass in and out of the top and bottom cushions at a controlled rate. The top and bottom cushions have sidewalls that compress when the top and bottom cushions are compressed. A flexible band is located around the side wall of at least one of the top and bottom cushions. The band is located outside of the cushion envelope and controls the flow of gas into and out of the respective cushion.

In accordance with another aspect, the enclosure is a rigid plastic box having electrically insulative surfaces.

In accordance with another aspect, the wafer stack is dissipative to static discharge.

In accordance with another aspect, the box can be stacked onto similar boxes. The box has top and bottom conductors on the outside and provide an electrical path to earth ground for the wafer stack. The top or bottom conductors are in contact with the top or bottom conductors of an adjacent box stacked with the one box.

In accordance with another aspect, the enclosure is a bag.

In accordance with another aspect, the enclosure is a rigid box within a bag.

In accordance with another aspect, a packaging system intercepts and captures corrosive contaminants for the protection of IC wafers during fabrication, transport and storage phases. The wafers have surface components such as bond pads, solder balls and interconnects which are susceptible to damage due to corrosion, mechanical shock or electrical static discharge. The packaging system comprises an enclosure having an interior volume and surrounding walls. A wafer stack is located in the interior volume. The wafer stack comprises plural wafers, with space there between to allow air to flow therethrough. A sacrificial material is located in the interior volume and has activated carbon and a metal. The sacrificial material intercepts and captures airborne molecular contaminants (AMCs), the material being dissipative to static discharge, the sacrificial material located adjacent to at least one of the walls.

In accordance with another aspect, the sacrificial material is a film and the metal is taken from the group of copper, aluminum, tin, silver and a rare earth.

In accordance with another aspect, the sacrificial material is a film that is coupled to a metal stud in at least one of the walls.

In accordance with another aspect, the sacrificial material is a film, further comprising a support that is coupled to the sacrificial material.

In accordance with another aspect, the sacrificial material is a pouch, the pouch having perforated walls made up of sacrificial material film, the pouch having a pouch interior, the pouch interior containing segments of the film.

In accordance with another aspect, the packaging system further comprises separators between the walls and the wafer stack. The separators have raised bumps extending therefrom. At least one of the separators is made of the sacrificial material.

BRIEF DESCRIPTION OF THE DRAWINGS

FIG. 1 is a perspective exploded view of a container and bag.

FIG. 2 is a perspective view of the container of FIG. 1 located in the bag.

FIG. 3 is a cross-sectional view taken through lines of FIG. 2.

FIG. 4 is a detailed cross-sectional view of a portion of the wafer stack of FIG. 3, in accordance with one embodiment.

FIG. 5 is a perspective exploded view of a wafer and a separator of FIG. 4.

FIG. 6 is a detailed cross-sectional view of a portion of the wafer stack, in accordance with another embodiment.

FIG. 7 is an exploded perspective view of a wafer, separator and ring of FIG. 6.

FIG. 8 is a plan top view of an air cushion.

FIG. 9 is a cross-sectional view of the cushion of FIG. 8, taken through lines IX-IX.

FIG. 10 is a perspective view of the cushion.

FIG. 11 is a cross-sectional view of a wafer stack in accordance with another embodiment.

FIG. 15 is a perspective view of an open FOUP shown with the film having sacrificial surfaces.

FIG. 16 shows a pouch made of film having sacrificial surfaces.

FIG. 17 is a cross-sectional view of FIG. 16 taken through lines XVII-XVII.

FIG. 18 is a cross-sectional view of an ESD arrangement of FIG. 15.

DESCRIPTION OF THE PREFERRED EMBODIMENT

Figure 12:
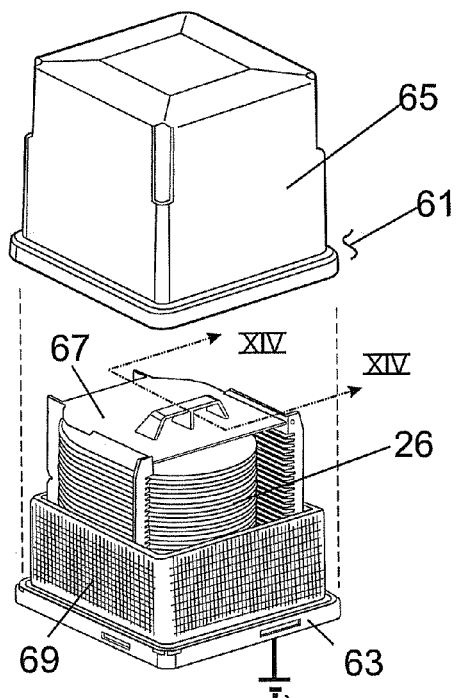
FIG. 12 is a perspective partially exploded view of a POD shown with a film having sacrificial surfaces.

There is described a packaging system and method for protecting IC wafers during fabrication, transport and storage. The packaging system and method decrease IC wafer die losses by: 1) reducing contaminants that come into contact with the IC wafers, which contaminants cause corrosion damage; 2) absorbing mechanical shock energy, thereby reducing wafer breakage; and 3) providing electrical conductivity to dissipate electrostatic discharge.

Contaminants that damage IC wafers are airborne molecular contaminants (AMCs) and can be of the organic type and inorganic type. These AMCs move around and contaminate IC wafers using environmental moisture vapors. In an analogy, the moisture vapors are "taxi-cabs" that transport the AMCs throughout an environment. The system as described allows for the circulation of these moisture vapors throughout the packaging system and provides sacrificial surfaces intercept and capture these AMCs before the AMCs reach the IC wafers.

The prior art uses either nitrogen purging or vacuuming the interior gas in a wafer container in order to remove contaminants. These prior art techniques remove moisture vapors from the container. This is in contrast to the system described herein, which does not seek to remove the moisture vapors from a vapor container. Instead, the sacrificial surfaces are used to intercept and capture, or isolate, the moisture vapors.

We have discovered that AMCs travel on moisture vapors. As an analogy, the moisture vapors are "taxi-cabs" that move the AMCs around. The system isolates and captures the moisture vapors and the AMCs associated therewith.

IC wafers are fragile and prone to breakage if dropped or bumped. The system as described provides protection of the IC wafers so that if the container or enclosure housing the IC wafers is dropped or otherwise subjected to mechanical shock energy, the shock energy is absorbed without damaging the IC wafers.

Electrostatic discharge, if improperly handled, can result in electrical damage to the IC wafer circuitry. The system as described protects the IC wafers against electrostatic discharge (ESD) events by providing a path to electrical ground at a certain resistance. Specifically, the resistance is 10E5 to 10E11 ohms.

The system as described utilizes enclosures or containers. Such enclosures include PODs, FOUPs and FOSBs, all of which are conventional and commercially available. Another enclosure 20 is shown in the figures herein (see FIGS. 1 and 3). Still another enclosure is a bag 30 having a flexible wall.

The IC wafers 25 are conventional and can be of any size, for example 150-450 mm. During the fabrication process, the IC wafers are initially considered to be "before probing". Certain enclosures may be used to house the IC wafers before they are probed. In probing, electrical tests are made to the electronic circuits on the IC wafers. After probing, certain other specialized containers may be used to house the IC wafers. The present invention can be utilized with enclosures used to contain the wafers before and with containers that contain the wafers after probing, as the IC wafers are subject to damage from AMCs, mechanical shock and ESD throughout the fabrication process, as well as during transport from one fabrication location to another, as well as during storage while the IC wafers await the next fabrication or transport step.

In the description, like reference numbers indicate like components.

FIGS. 1 and 2 illustrate container 20 and bag 30 whereas said container is packaged within said bag. The packaged unit 10 is shown in FIG. 2. The enclosure is the packaged unit 10. The enclosure can also be the container 20 by itself or the bag 30 by itself. The container need not be used with the bag. Likewise, the bag need not be used with the container. Container 20 is made from a plastic resin having no carbon. Carbon by nature, as a material, has moisture vapor absorbing cells and is used within most present day wafer shipment containers to avoid ESD events. However this is a recipe for a warehouse to absorb environmental moisture vapors laced with environmental corrosive AMCs thus producing "corrosive soups" that could damage surfaces of packaged wafers. On the other hand, bag 30 is made of special polymer film that reacts with and permanently neutralizes all reactive AMCs (inorganic) and absorbs all other AMCs (organic) within container 20. Specifically container 20 is designed for not absorbing moisture vapors that could be laden with environmental AMCs.

FIG. 3 is a cross-sectional view of the packaged unit 10. The container 20 has a top cover 21 and a bottom cover 22. The enclosure contains a wafer stack made up of wafers 25, wafer separators 27 and activated air cushions 23. There is an air cushion 23 located in bottom cover 22 and another air cushion 23 is located in top cover 21. A separator 27 is provided between each two adjacent wafers 25. The container 20 is enclosed and placed inside of the bag 30, through an end 31 that need not be sealed and remains open. The open end 31 of said bag 30 has the purpose to accept the presence of environmental moisture vapors in the interior space 13. Some amount of environmental moisture vapors laced with some amount of AMCs will always reside within the enclosure interior space 13 and said vapors will always be mobile and therefore will become "taxi-cabs" to transport said residing AMCs to the sacrificial surfaces of separators 27 and surface of said bag 30 for which both have the ability to chemically react with and permanently neutralize said AMCs belonging to the inorganic family and absorb all other AMCs belonging to the organic family. The sacrificial surfaces "intercept and capture" moisture vapors and AMCs to protect the packaged IC wafers from "corrosive damages" during shipment and/or storage stages.

The bottom cover 22 is provided with multiple rubber type vertical isolators 22b peripherally located therein for which arrangement associates with an air cushion 23 located in bottom cover 22 corresponding with or relating to an air cushion 23 located in top cover 21. The combination of multiple vertical isolators 22b in unison with cushions 23 as an assembly within container 20 has the purpose to prohibit or restrict vertical and/or lateral motion that can damage packaged wafers traceable to improper packaging methodology while simultaneously absorbing mechanical shock energy traceable to mishandling of container 20 during any transport phase. The packaged IC wafers are protected from "motion related damages" during shipment and/or storage stages.

FIG. 4 is a detail cross-sectional view of the portions of the wafer stack 26, while FIG. 5 shows a wafer 25 and a separator 27. The wafer(s) 25 are separated by one or more separators 27. In the preferred embodiment, there is a separator 27 between adjacent wafers 25. Each separator 27 is a sheet-like material having two sides (referring to the orientation of FIG. 4, a top side and a bottom side). Bumps, or embossments, 27a, 27b extend out from each side. Thus, bumps 27a extend upwardly from the top side and bumps 27 extend downwardly from the bottom side. The bumps 27a are spaced apart from each other; likewise, the bumps 27b are spaced apart from each other. The bumps may be arranged in rows, with every other bump 27a extending in one direction and the remaining bumps 27b extending in the opposite direction so as to evenly distribute the bumps. When the wafers are stacked as shown in FIG. 4, with a separator 27 between each two wafers 25, the bumps 27a, 27b form standoffs that contact the circuit side and back side of the adjacent wafers. Air can circulate through the spaces 28a, 28b between the wafers and the separators, which spaces are created by the bumps 27a and 27b.

The separators 27 are made from a polymer sacrificial film, or capture material, having one or more layers. The film is a polymer, activated carbon and a chemically reactive metal such as copper, aluminum, tin, silver or a rare earth, such as samarium. For specifics on the film, reference is made to U.S. Pat. Nos. 4,944,916 and 5,154,886, the entire disclosures of which are incorporated herein by reference. In one embodiment, the film has three layers, namely a first copper layer, a carbon layer and a second copper layer, with the carbon layer being interposed between the two copper layers. As an alternative, the film can have two layers, one of copper, the other of carbon. Each layer has a polymer. Examples of suitable polymers are polyethylene and polypropylene. The copper layers have polymer and copper (or other reactive metal) while the carbon layer has the polymer and activated carbon. The layers are bonded together. The separator film intercepts and isolates AMCs, whether of the organic or inorganic type. As the air moves through the spaces, or reactive zones, 28a, 28b, the inorganic AMCs are neutralized by the separator film and the organic AMCs are absorbed by the separator film. In particular, it is believed that the copper, or other metal in the separator film, neutralizes the inorganic AMCs while the organic AMCs are absorbed by carbon in the film. The AMCs do not contact the IC wafers and do not cause corrosive damage.

The bumps 27a, 27b not only create spaces 28a, 28b, but also serve to reduce mechanical shock energy transferred to the wafers 25, such as if the enclosure 10 is dropped. The bumps have some "give" or flexibility that serve to cushion the wafers in the event of a mechanical shock.

The bumps 27a, 27b cushion the wafer stack along a longitudinal axis of the wafer stack, wherein the wafers are oriented transversely to the longitudinal axis. Thus, in FIG. 4, the longitudinal axis would be vertical. The separators 27 also cushion the wafers 25 from mechanical shock in a direction transverse to the longitudinal axis, or parallel to the wafer discs. Each separator 27 is provided with a peripheral bump or embossment 27c. The height (referring to the orientation of FIG. 4) of the peripheral embossment 27c is greater than the sum of the height of the top side bumps 27a and the wafer 25 thickness, but less than the sum of the heights of the bumps 27a, 27b in the wafer thickness. In this manner, the embossment is high enough so as to cushion the edge of the wafer, yet short enough so as not to interfere with the cushioning of the bumps 27a, 27b against the wafers 25. The peripheral embossment 27c extends around the periphery of the separator. In the preferred embodiment, the peripheral embossment is continuous. However, the peripheral embossment can be discontinuous and contain gaps therein. The separator 27 has an outer or peripheral edge 27d that interacts with the vertical isolators, or cushions, 22b. If the wafer stack is subjected to mechanical shock having a component parallel to the wafers, the wafer edge is cushioned by the "give" of the peripheral embossments 27c and by the cushions 22b. The separators also prevent lateral motion of the wafers, which motion can cause surface scratching of the wafers.

The wafer stack embodiment of FIGS. 6 and 7 is substantially similar to that of FIG. 4. The wafer(s) 25 are separated by one or more plastic ring separator(s). Plastic ring separator is an assembly having a rigid ring 26 made of plastic and separator 27 made from the same said special polymer film having the same said embossments of 27a, 27b. The ring 26 has a shoulder 26a for receiving the wafer edge. The ring 26 thus contains the wafer and prevents lateral movement. The separator 27 is coupled to the ring 26 for which top side to provide a related step 26a peripheral located designed in a manner to receive a packaged wafer 25. As the wafers are stacked, the separator bumps 27a, 27b may compress. If the wafers have protrusions, such as bond pads or solder balls, the distance between wafers diminishes. This arrangement with the ring 26 provides sufficient height to provide adequate clearance to protect surfaces of elevated members such as ball bond pads located on the surface of said wafer 25 packaged. In addition to the feature of protecting elevated members on surfaces of packaged wafer(s) 25 such as bond pads, separator 27 prevents damage due to corrosion, breakage and mishandling.

FIG. 8 is a top view of air-activated cushion 23 constructed from the same said static dissipative sacrificial film used for the separators 27, followed by shown cross-sectional view FIG. 9. Air activated cushion 23 has multiple activating air valves 23a, which automatically relates to the volume of atmospheric air contained within said cushion 23. Each valve establishes a "rate" of discharge of air contained in the cushion 23 dependant upon the amount of mechanical shock energy generated by any "impact" created by any mishandling of container 20 for which is the means to absorb and or isolate shock of energy that could otherwise cause crack or outright breakage damage to one or more wafer(s) 25 during transport phases to include shipment/storage stages. Whereas said air valves 23 will act to reset said cushion 23 with the same said atmospheric air when not under the stress of any "impacts". This serves to maintain equal pressure on packaged wafers within container 20 that serves to control both vertical motion along the longitudinal axis and lateral motion parallel to the wafers having the purpose to reduce scratch and breakage damage while simultaneously serving the purpose in assisting removal of top cover thus minimizing even further wafer damaging possibilities.

The use of air cushions may cause air flow inside of the enclosure. This air flow contains AMCs from exterior sources and interior sources (such as by outgassing). The use of the sacrificial film in both the separators and cushions will intercept and capture AMCs.

Each cushion has a top wall 23b, bottom wall 23c and a side wall 23d which is generally cylindrical, as well as a expandable fiber core 23e made of a polymer having memory located inside of the walls. The walls are made from a flexible film. The foam is compressible. A band 41 is located around the side wall 23d (see FIGS. 9 and 10). The band 41 regulates flow of air between the film and the core 23 e and consequently regulates the compression and expansion of the cushion 23. With the band 41, the response time to compress and expand the cushion is slower than without the band.

The wafer stack of FIG. 11 can have the wafers oriented either vertically, such as in a POD, or horizontally, such as in a FOUP or FOSB. The wafer holder 51 may also be known as a wafer boat. The wafer stack of FIG. 11 has no air cushions 23.

Regarding ESD, container 20 has surfaces greater than >10E11 ohms, while separators 27 and cushions 23 and bag 30 have dissipative surfaces ranging from >10E5 to <10E11 ohms. This arrangement provides a conductive electrical circuit to grounding studs 32 (see FIG. 3) having a surface resistance (SR) less than <10E5 ohms centrally located within top cover 21 and bottom cover 22. This is the method to provide an electrical path to earth ground for the purpose to protect packaged wafer(s) 25 from ESD events. A path for ESD is provided from the wafer stack to ground 32A by way of the separators 27, the film 69 around cushions 23, and the grounding studs 32. Whereas this feature when added to the feature of container 20 made of resins with no moisture absorbing activated carbon or chemical additive constituents resulting in insulative surfaces having a SR greater than >10E11 ohms for which arrangement remains within the concepts of this invention with the purpose to isolate accumulation of environmental moisture vapors possibly laced with environmental corrosive AMCs creating "corrosive soups" to cause corrosive damage to packaged wafer(s) 25 within the environment of said container 20.

The container 20 or box is designed to be stacked so that several containers 20 can be stacked together. When stacked, the top grounding stud 32 of the lower container contacts the bottom grounding stud of the upper adjacent container so as to provide electrical continuity to ground.

The cushions 23, and in particular the walls 23b, 23c and 23d of the cushions can be made out of the same polymer film 69 as the separators, which film will isolate and intercept the AMCs. It is preferable to provide one or more components of the wafer stack, namely the separators and/or cushions, made from the film so as to intercept and isolate the AMCs.

The film is considered to be sacrificial in that once it has been used to intercept and capture AMCs, then over a period of time it will lose its ability to continue to intercept and capture AMCs. Therefore, the components made from the film should be considered to be for one time use only and should be disposed after use. Thus, when a fresh batch of wafers is loaded into an enclosure, such as a container 20, then fresh separators 27 and cushions 23 should be included as well.

In addition to the separators 27 and cushions 23, the bag 30 can also be made of the sacrificial polymer film 69, which film intercepts and isolates AMCs. The opening 31 of the bag is left open and unsealed. This allows air containing moisture vapors, and thus the AMCs, to enter and egress from the bag, wherein the film can perform its function to intercept and isolate the AMCs. The container 20 need not be sealed, and can in fact be unsealed for the same purpose, namely to allow air flow to enter and exit the container, which air flow contains the moisture vapor and thus the AMCs. By locating the sacrificial film in a position adjacent to the wafers, then the film will intercept and isolate the AMCs and thus prevent the AMCs from contaminating and causing corrosion damage to the wafers.

Thus, the enclosure with the sacrificial film can be a rigid container such as a container 20 shown in the drawings, or a POD, FOUP or FOSB, or a flexible container, such as a bag 30, or a combination. An example of a combination is a rigid container inside of the bag 30.

Figure 13:
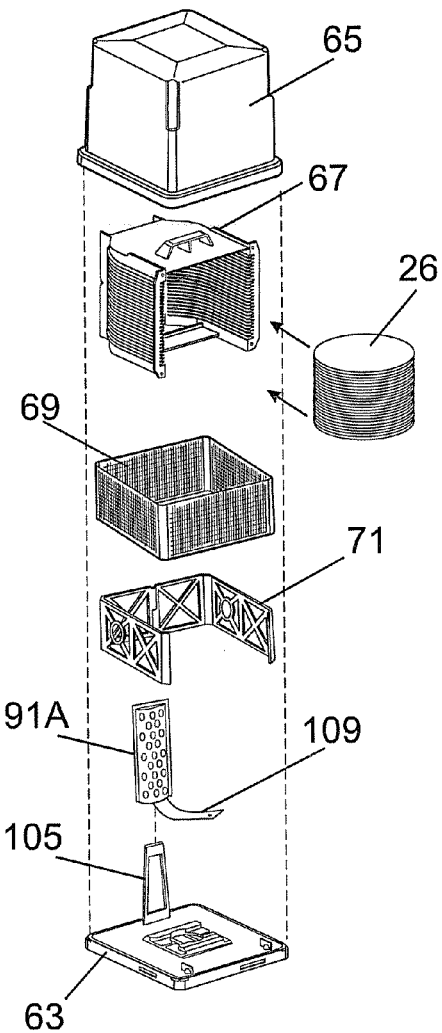
FIG. 13 is an exploded view of the POD of FIG. 12.

In addition to the separators being made of the film having sacrificial surfaces, the film can be used elsewhere. FIGS. 12 and 13 show a POD 61. The POD has a bottom member 63, a top cover 65 and a wafer boat 67. The wafer boat 67 contains the wafer stack 26. These components of the POD are conventional and commercially available.

The POD 61 is modified to provide the film having sacrificial surfaces outside of the wafer stack 26 and inside of the POD 61. A film 69 of the same sacrificial material as the separators 27 is provided outside of the wafer stack. The film can be of any shape or configuration. As shown in FIGS. 12 and 13, the film 69 forms the sides of a tube, where the top and bottom of the tube are open to receive the wafer boat. A support 71 is provided to hold the film up in its tube, or vertical, configuration. The film 69 is located around the support 71. The film can be tacked or coupled to the support, although this is not required. To access the wafer stack in the POD, the film is removed from the POD.

FIG. 15 shows a FOUP 75. The FOUP has side walls 77, a rear wall 79, a top wall 81, a bottom wall 83 and a door 85. A rack 87 is provided on the side walls 77, which rack receives the wafers. The wafers are inserted into the rack to form a wafer stack. Film 69 is provided on the inside of the side walls 77, as well as the inside of the rear wall 79 of the inside of the door 85. The film does not interfere with the use of the rack 87.

Thus, FIGS. 12-13, 15 show the use of film 69 that is external to the wafer stack, but internal of the enclosure.

The sacrificial film 69 can be provided in sheet form, or in other forms, such as a pouch 91, as shown in FIGS. 16 and 17. The pouch 91 is made of the film 69, folded along one side 93 and sealed along the other sides 95. The film is perforated with holes 97. Inside of the pouch are pieces or segments 99 of the film. These pieces are film that have been chopped or cut so as to decrease their size. The pieces 99 are larger than the holes 97 so that they remain inside of the pouch.

The sacrificial film 69, whether it is a sheet or a pouch, is coupled to the walls of the container 75 by an adhesive. Any AMCs produced by the adhesive are intercepted and captured by the film. The film allows the use of commercial containers such as PODs, FOUPs and FOSBs. The containers are retrofitted with the film.

Figure 14:
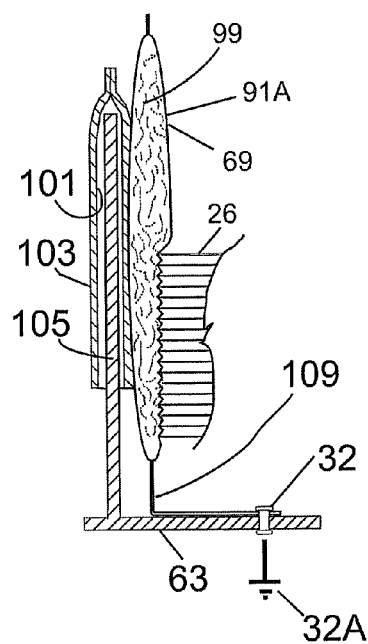
FIG. 14 is a cross-sectional view of an ESD arrangement, taken through lines XIV-XIV of FIG. 12.

The enclosures shown in FIGS. 12 and 15 have ESD arrangements that provide paths to ground from the interior of the enclosure to the exterior. For a POD 61, as shown in FIGS. 13-14, the wafer stack 26 contacts the film 69, which provides a path to ground 32A. A pouch 91A is provided. The pouch 91A is substantially similar to the pouch 91. A pocket 101 is provided. The pocket 101 is formed by a sheet 103 of film attached to the pouch 91. The pocket 101 is open at the bottom to receive a support 105. A tab 109 of the film 69 extends from the pouch to a grounding stud 32, which can be a screw to allow replacement of the film and pouch. The pouch 91A is located at one of the open ends of the wafer boat. When installed in a POD, the edges of the wafers in the wafer stack 26 contacts the film 69 on the pouch 91A. The support is conductive, thus an electrical path to ground 32A is provided by way of the pouch 91A and the support 105.

As the wafer boat is placed into or removed from the base 63, the pouch can be pushed away slightly so as not to catch the edges of the wafers during insertion and removal. The support 105 is resilient and moves the pouch 91A into contact with the wafer stack 26. The pouch and support are released. The pouches 91, 91A are resilient as well, and provide some cushioning to the edges of the wafers.

FIGS. 15 and 18 show a similar ESD arrangement for the FOUP 75 (and can be used on a FOSB as well). The pouch 91A is secured to the rear wall 79 by adhesives. A tab 109 of film 69 extends to a grounding stud 32. As a wafer is inserted into the wafer stack 26, its edge contacts the pouch 91A, thus having a path to ground, by way of the film in the pouch 91A, the grounding member 111 and the grounding stud 32, for an ESD event.

The use of a grounding path from the wafer stack 26 to ground 32A in an enclosure such as a POD, FOUP or FOSB allows the enclosure to be fabricated with either activated carbon or chemical additives. Activated carbon and/or chemical additives are used to enhance ESD protection of the wafers, but increase damage to the AMCs.

The film has a limited useable life. After being used for so many cycles of wafer stacks, the ability of the film to capture and seize becomes degraded. The used film is replaced with fresh film and the container remains in use in processing and transporting wafers.

The foregoing disclosure and showings made in the drawings are merely illustrative of the principles of this invention and are not to be interpreted in a limiting sense.

The invention claimed is:

1. A packaging system for intercepting and capturing corrosive contaminants for the protection of IC wafers during fabrication, transport and storage phases, such wafers having surface components comprising bond pads, solder balls and interconnects which are susceptible to damage due to corrosion, mechanical shock or electrical static discharge, comprising:
   a) an enclosure having an interior volume and surrounding walls;
   b) a wafer stack located in the interior volume, the wafer stack comprising plural wafers, with space there between to allow air to flow therethrough;
   c) a sacrificial material located in the interior volume and having activated carbon and a metal, the sacrificial material intercepts and captures airborne molecular contaminants, the sacrificial material being dissipative to the static discharge, the sacrificial material located adjacent to at least one of the walls;
   d) a pouch, the pouch having a perforated wall, with a pouch interior, the sacrificial material comprising a film, the film being segments located the pouch interior.

2. The packaging material of claim 1 wherein the metal is taken from the group of copper, aluminum, tin, silver and a rare earth.

3. The packaging system of claim 2 wherein the sacrificial material is a static dissipative film that is coupled to a metal stud in at least one of the walls.

4. The packaging system of claim 2 further comprising a support that is coupled to the sacrificial material.

5. The packaging system of claim 1 further comprising separators between the walls and the wafer stack, the separators having raised bumps extending therefrom, at least one of the separators being made of the sacrificial material.

6. The packaging system of claim 1 wherein the pouch contains plural layers of the film segments.

7. The packaging system of claim 6 wherein the pouch is in contact with the wafers and provides mechanical cushioning for the wafers.

8. The packaging system of claim 1 wherein the film segments in the pouch interior are larger than the perforations of the pouch wails.

9. The packaging system of claim 1 wherein the enclosure comprises a bag.

10. The packaging system of claim 9 further comprising a rigid container located in the enclosure interior volume, the wafer stack located inside of the container.

11. The packaging system of claim 10 wherein the pouch is located inside of the container.

12. The packaging system of claim 1 wherein the wafer stack is stored in the enclosure, with the enclosure being open to air outside of the enclosure.

13. The packaging system of claim 1 wherein the perforated wall pouch is made of the sacrificial material film.

* * * * *